(12) United States Patent
Bayne

(10) Patent No.: US 6,685,419 B2
(45) Date of Patent: Feb. 3, 2004

(54) MOBILE ELEVATOR TRANSPORTER FOR SEMI-AUTOMATIC WAFER TRANSFER

(76) Inventor: Christopher John Bayne, 16548 Oleander Ave., Los Gatos, CA (US) 95032

(*) Notice: Subject to any disclaimer, the term of this patent is extended or adjusted under 35 U.S.C. 154(b) by 64 days.

(21) Appl. No.: 09/901,744

(22) Filed: Jul. 10, 2001

(65) Prior Publication Data

US 2003/0012629 A1 Jan. 16, 2003

(51) Int. Cl.[7] ............................................. B65G 49/07
(52) U.S. Cl. ........................ 414/331.04; 414/331.11; 414/331.14; 414/940
(58) Field of Search ................................ 414/172, 191, 414/192, 222.04, 222.05, 222.09, 223.01, 331.04, 331.07, 331.11, 331.14, 940

(56) References Cited

U.S. PATENT DOCUMENTS

| | | | | |
|---|---|---|---|---|
| 4,669,938 A | * | 6/1987 | Hayward ..................... 414/156 |
| 4,701,096 A | * | 10/1987 | Fisher, Jr. ................ 414/416.08 |
| 4,829,445 A | | 5/1989 | Burney ........................ 364/478 |
| 4,872,799 A | * | 10/1989 | Fisher, Jr. ................... 414/180 |
| 4,888,994 A | * | 12/1989 | Nakamaki et al. ............ 73/760 |
| 5,468,111 A | * | 11/1995 | Flint et al. ................ 414/416.08 |
| 5,570,990 A | * | 11/1996 | Bonora et al. ............... 414/543 |
| 5,655,869 A | * | 8/1997 | Scheler et al. ........... 414/222.01 |
| 5,838,566 A | | 11/1998 | Conboy et al. ........... 364/468.22 |
| 6,033,175 A | * | 3/2000 | Pflueger et al. ............. 414/401 |
| 6,035,245 A | | 3/2000 | Conboy et al. ............. 700/214 |
| 6,102,647 A | * | 8/2000 | Yap ............................. 414/539 |
| 6,157,866 A | | 12/2000 | Conboy et al. ............. 700/121 |
| 6,169,935 B1 | * | 1/2001 | Iwasaki et al. ............. 700/214 |
| 6,205,881 B1 | * | 3/2001 | Gravell et al. ............ 74/483 R |
| 6,454,512 B1 | * | 9/2002 | Weiss ......................... 414/663 |

* cited by examiner

Primary Examiner—James W. Keenan
(74) Attorney, Agent, or Firm—Perkins Coie LLP

(57) ABSTRACT

A portable assembly allows semiconductor wafer boats to be transported safely from one semiconductor processing device to another semiconductor processing device at low cost using a small amount of the fabrication area without the need for complicated automated systems. The portable assembly includes two hollow bodies, of which one body may be elevated electromechanically to the height of a cantilever oven opening. The elevation may be conducted manually or automatically. The upper body of the assembly contains a rotating drum which further includes four segmented cylinders, which store and queue the wafer boats. The lower body contains a safety shoe locking apparatus which allows the elevator mechanism to be activated only when the assembly is docked in the appropriate location. The assembly also contains storage areas for wafers in progress. The assembly is moved manually on a set of wheels and may be rotated about its axis.

27 Claims, 10 Drawing Sheets

MOBILE ELEVATOR TRANSPORTER FOR SEMI-AUTOMATIC WAFER TRANSFER

FIELD OF THE INVENTION

The present invention relates to industrial-mechanical devices that assists in the production of semiconductors and improve the safety and efficiency of the semiconductor manufacturing environment.

BACKGROUND OF THE INVENTION

Currently, there are a variety of tools available to assist the semiconductor processing personnel in handling of semiconductor wafer boats. However, much of the risk in the semiconductor-manufacturing environment still includes poor ergonomic practices, which subject the handlers to personal risk and the very expensive product to contamination risks. One of the most inefficient and risk prone dangerous areas are the horizontal furnaces used to process the silicon wafers.

There are small tools for safe handling and transporting of silicon wafers, which include vacuum wands, manual wands (wafer tweezers), vacuum pumps (spurious), tubing, and tweezers for various size wafer handling, etc. Mactronix, Amtech, TEL Tokyo Electron Ltd, Fluoro Mechanic of Tokyo, Japan, and Tystar of Torrance, Calif. are examples of companies that manufacturer these advanced wafer handling tools for the semiconductor industry.

However, currently there is very little automation of the horizontal furnace process in use despite the fact that there have been great advances in the automation of wafer handling up to and around the furnaces. The actual critical steps of loading and unloading wafers boats from horizontal furnaces despite two decade's worth of attempts to improve productivity around the loading and unloading of furnaces, still resist the applications of automation.

This lack of automation tools around the horizontal quad stack furnace is surprising, since operators in the fabrication areas are challenged to perform awkward, inefficient, and hazardous manual tasks when in physical possession of expensive wafer loads.

Examples of overall automated material processing systems for the semiconductor manufacturing environment are contained within U.S. Pat. Nos. 6,157,886 and 6,045,235, and 5,838,566 developed by Conboy, et. al. and owned by Advanced Micro Systems of Sunnyvale, Calif. It is unclear whether such systems are commercially viable on a mass scale because of the expense of retooling of the fabrication area to employ such a customized comprehensive fabrication system. Additionally, these computer-controlled comprehensive method(s) for managing material fabrication are not really relevant to the actual physical processes involved in the fabrication area, but more to a general method of manufacturing control and optimization. Another example of complex automated material handling units is taught by U.S. Pat. No. 4,829,445, which is illustrated by FIG. 2 and invented by Burney and owned by National Semiconductor Corporation of Santa Clara, Calif. However, this invention is directed at a particular device/system for material processing but like the above patent, requires extensive installation and computer controls and expense.

In general, the complex automated solutions are too expensive. They are slow (reducing throughput), with an ever-present risk of cross-contamination, difficult to install and maintain, with a maneuverable space requirement, which is much greater in practice than claimed by some suppliers. Such systems require high cost in time, space, and expense, in most instances actually reduce the throughput of the furnace, hampering productivity. Claims made by entities investing in full furnace automation on the grounds that it prevents "miss processing" by the operator are often largely exaggerated. Hence, the semiconductor industry has found it more effective to continue to employ operators despite the continued risks to both operator and product.

FIG. 1 represents a typical quad stack horizontal furnace 10 for processing semiconductor wafers. The furnace consists of four furnace tubes, with cantilevered loaders 12, 14, 16, 18 on which wafer boats containing typically 50 wafers must be carefully placed. Furnace 12 and 14 will exist at a height of 80 and 60 inches or greater respectively above the floor level. When cantilever-loading systems became popular in the 1980's it was expected that automation of the loading and unloading of such semiconductor processing devices would quickly follow. Despite some very ambitious attempts by furnace manufacturers and other companies to automate the process, the numbers of fabricating environments employing automated furnace loading are a tiny minority. Horizontal furnace automation has been unsuccessful for several reasons, mainly capital expenditure, high maintenance costs, reduced throughput, and difficulty of installation among others.

Because automation attempts have failed due to the above-mentioned expense and convenience issues, the semiconductor wafer boats are still handled manually around the furnace. The first difficult set of actions performed by a typical operator is the action of unloading the top tube of the quad stack horizontal furnace at level 12, which is typically approximately 80" above floor level. Typically, operators climb up and down (backwards) a set of 2 or 3 steps with some hand held fork lift device to remove a single wafer boat from the cantilever. The loading process is the reverse, climb up with load in one hand, load and climb down empty handed, backwards. In all a total of 24 trips are needed to load and unload (6×2=12 boats=600 wafers) the wafer boats from a typical single tube process.

What is needed is a simple solution to bridge the gap between the expense and complexity of full automation and reducing the responsibility and risks to operators that is affordable and does not require extensive retooling of the fabrication area.

SUMMARY OF THE INVENTION

The present invention addresses many of the above discussed needs by facilitating sensible, safer and ergonomically efficient loading, unloading, and transporting of silicon wafers in the manufacturing environment, all at a relatively small cost to the semiconductor manufacturer. The present invention represents an effective low cost contribution to the improved productivity of horizontal furnace processing.

It is the object of the present invention, the Elevator/Transporter (also referred to as the "E/T"™), to uniquely combine a means by which batches of semiconductor wafers, can be transported back and forth between any of the furnaces (left hand or right hand configuration) and any of the "transfer stations" in the fabrication area, elevated to any required cantilever level and back down to the correct height for easy loading/unloading at the transfer station, store and queue the wafers in one self contained apparatus. The present invention is simple, affordable, requires the use of little space in the semiconductor fabrication area, and that which it does require, since it is mobile, is a non issue as it can be simply rolled out of the way as necessary to provide space.

Using the present invention, wafers are staged by the operator from the transfer station prior to hot processing and loaded into a rotating drum feature on the invention. The device is wheeled or rotated about its axis, depending on the configuration of the fabrication area, over to the furnace where the operator presses the button to raise the drum to the required, pre-set, load level. In a typical operation, using the optional steps, the operator climbs to tube level, with both hands free for safety. The operator is now able to unload the cantilever of the processed wafers and place them into the invention.

The operator rotates the drum bringing up the next batch for the furnace and while still in position loads the cantilever and starts the next run. The operator can then climb down the steps with both hands now free and wheel the invention with processed wafers safely enclosed, to the next workstation.

The resulting benefits of using the present invention are described in the bullet points below but briefly stated the present invention provides safer, quicker, more reliable furnace loading of semiconductor wafer boats, with a very low cost of ownership and a minimum of disruption to the fabrication area. This simple, cost effective solution offers some huge advantages. Although the present invention is not fully automated, it reduces both the ergonomic stress on the operator and the risk to wafers and thus improves productivity. Optional features of the invention, like automatic height elevation, also allow for the reduction of operator error.

The key features of the preferred embodiment of the invention and benefits of the invention over the existing prior art are:

- The invention replaces the manual loading of 300 wafers in 6 boats and unloading of 300 in 6 boats (total 12 boats or 600 wafers moved) requiring a total of 24 trips (12 trips up and 12 trips down). The invention can be safely pre-loaded with 6 boats, from the transfer station at floor level, in the delivery drum, wheeled to the furnace and by the elevation to cantilever level and rotation of the drum, provides the operator positions in which to place 6 boats of wafers already processed in the furnace. This means that while on the steps, at the requisite cantilever level the operator can unload 6 boats, rotate the drum and load 6 boats in only 2 trips (one trip up and down) the steps instead of 24 trips. Such a reduction in trips and having both hands free drastically reduces the odds of injury to the handler and damage to the expensive product.
- In a preferred embodiment, the invention will allow for the transport of 600 wafers in 12 wafer boats.
- The handler usually has only one hand free while loading and unloading the expensive wafers. The present invention allows the handler to have both hands available after the wafer boats are loaded for climbing and lowering to other levels.
- The present invention also allows the handler to reduce the extreme ranges of motion required to load and unload wafer boats into and out of quad stack furnace.
- The present invention requires that the process tube remain open for less time than in a manual-loading situation, which means that there is significantly less chance of product cross-contamination. Throughput is also increased.
- The present invention allows for the queuing of wafer boats and color-coding of the cradles into which the wafer boats are loaded for lot identification, thereby reducing the ever-present risk of miss processing. With the present invention the next batch of wafers to be processed is always ready, increasing throughput.
- The present invention, unlike some complex automated systems discussed above, does not require the fabrication area to be retooled. The E/T™ can be implemented in the fabrication process immediately with the exception of the "shoe" installation, which stabilizes the E/T™ at the loading station.
- The footprint of the present invention is small, approximately 30"×30" and mobile. Thus, it can be multiplexed to serve numerous furnace stacks/transfer stations in a small amount of highly valuable space. Additionally, the invention's mobility means that it is never in the way when the furnace equipment needs servicing, which is a major disadvantage of fixed, hard automation.
- In one of the preferred embodiments in which the height of the cantilevers is programmed into the elevator controls to assist the operator/handler, the programming can literally be done in a couple of minutes using the "set loading/unloading height" feature.
- The invention requires very little maintenance because of its simple design. The breakdown on an E/T™ while unlikely will only require minutes to repair, whereas automated systems could take days or weeks to repair, at multiples of costs of the purchase of a single E/T™.
- The invention has an optional feature where the boat trays are color coded for Lot Tracking.
- The ET has "on board" storage of the Lift Tools so that they are always available at the point of use, which further facilitates safety and ergonomic efficiency.
- The invention saves money over full automation. If full automation is used instead of present invention then one system per furnace stack is required, each costing up to ten (or greater times the price of the invention.
- The invention is designed so that there is no wafer over wafer movement, which reduces the risk of wafer damage and particle contamination.

The invention includes means for loading silicon wafer boats into a series of circularly placed storage half cylindrical trays (herein also referred to a "cylindrical cradles" or "cradles"), which are contained, on a rotating drum. The drum not only allows for easy loading of a silicon wafer boat, onto a cantilever and into the furnace, but can be raised and lowered to a pre-determined height pneumatically, hydraulically or electrically, to allow for easy load for any furnace height.

In addition to the improved ergonomics of wafer boat loading and unloading, the rotating drum allows for multiple cradles, which are designed for "offset" boat positioning and the correct queuing of the wafer boats. This provides the operator with a positive visual guide to the sequenced loading/unloading of the boats meaning that they are less likely to misprocess the product by placing the wafer boats in the wrong location.

An optional embodiment of the invention includes an attachment for steps, which may or may not include the option to have steps or an elevating platform (with or without a safety gate) built into the elevator-transporter body. A preferred embodiment of the invention leaves the step features out so that each fabrication area using the E/T™ can use stairs that comply with local, state, and federal regulatory standards regarding the use of stairs or elevating platforms.

The invention also includes an optional feature for automating the wafer transfer process between furnaces with the use of the Elevator/transporter, with the use of a automatic drum rotation. However, the preferred embodiment features the low cost elevator transporter without such automatic wafer transfer/rotator. Such an automated feature significantly drives up the costs of the invention. It is anticipated that although some semiconductor manufacturers may desire the inclusion of the mentioned optional features, low manufacturing cost will remain a primary selling point of the invention.

These and other advantages of the present invention will become apparent upon reading the following detailed descriptions and studying the various figures of the drawings.

DEFINITIONS

The following expressions are used in the specification and claims:

"Semiconductor wafer processor" or "operator" is any employee of a semiconductor fabrication plant who loads and unloads wafers from a processing device. Generally, referred to as a handler or operator in the specification.

"Semiconductor wafer container" is any container that holds a set of semiconductor wafers for processing, such containers are commonly referred to in the industry as "silicon wafer boats," or "wafer boats."

"Semiconductor processing device" is any device in which the semiconductor wafer is placed that is used in the manufacture of the semiconductors, usually cantilever loaded horizontal stack furnace, but is easily applied to other semiconductor wafer manufacturing devices.

"Cradle" is interchangeable with "tray," "tube" or "cylinder" and is used to describe a feature of the present invention, but has no particular meaning to those skilled in the art nor should be used to limit the scope of the invention.

DETAILED DESCRIPTION OF THE INVENTION

While the present invention has been described in terms of several preferred embodiments, there are many alterations, permutations, and equivalents, which may fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

Figure 3:
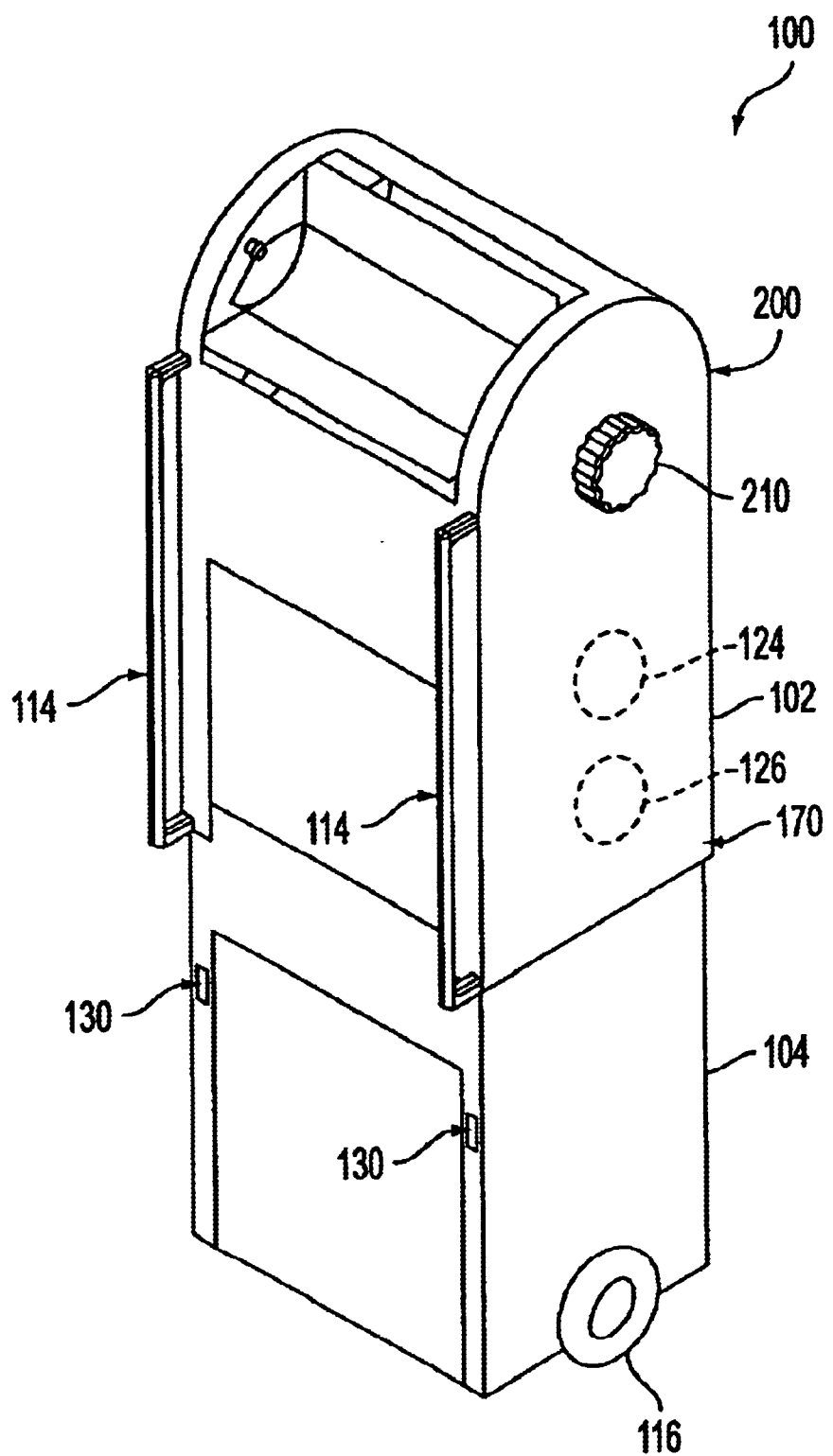
FIG. 3 is a side-view of the present invention.
Figure 4:
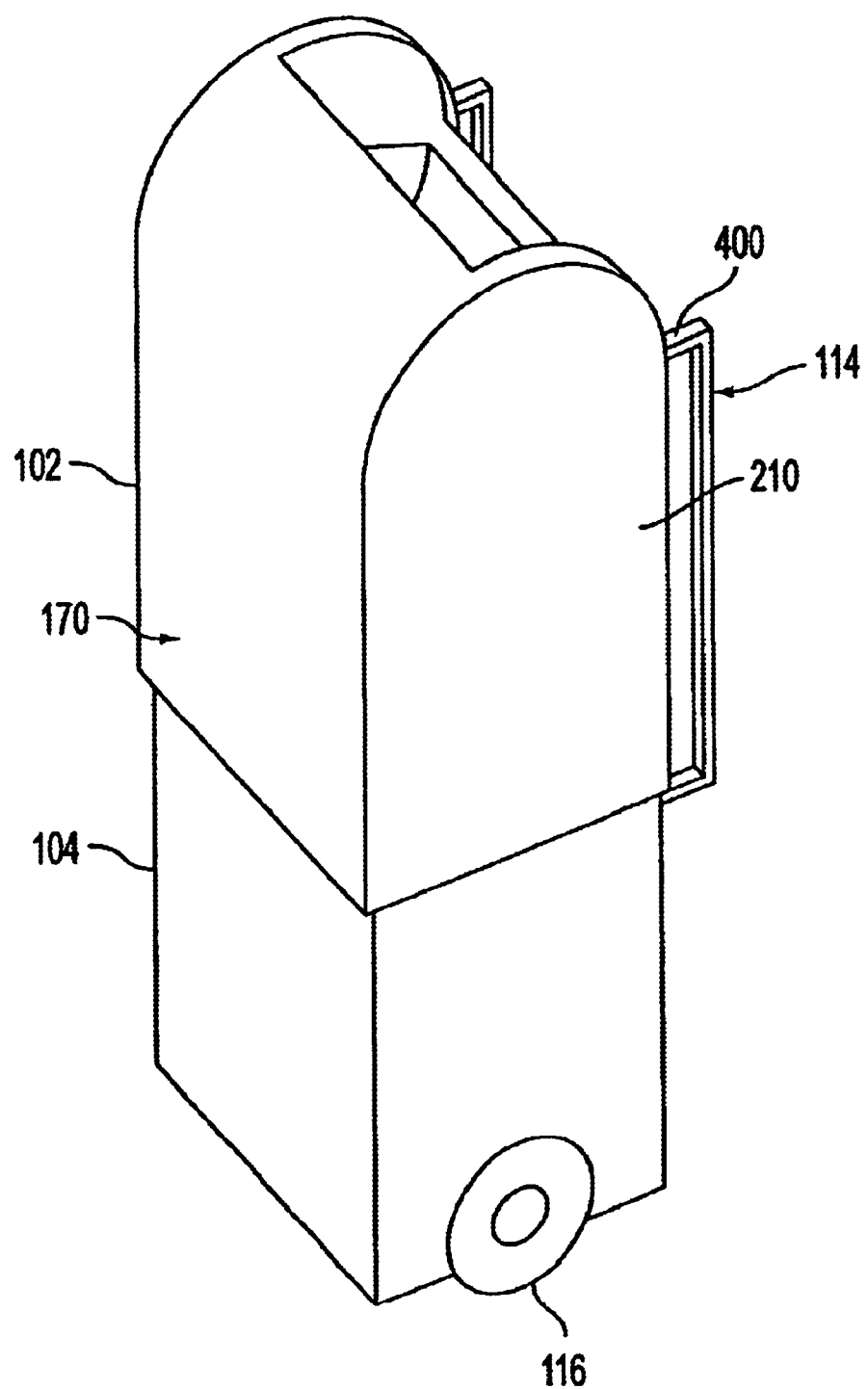
FIG. 4 is top rear view of the present invention.

Referring now to FIGS. 3 and 4, which are side view and top view diagrams of the present invention, respectively, a semiconductor container elevator/transporter (E/T™) 100 in a preferred embodiment is shown. The invention includes an elevator body 102, and a transporter base 104, a rotating drum system 200, with manual rotation control 210. The E/T also has a set of wheels 116, on which it can be transported and rotated about its axis. An optional feature allows for a stairs attachment to the base 130. The invention also contains an elevator mechanism 170 which is pictured in detail below.

The invention has optional clean storage containers 124 and 126, which may be used to store WIP (work-in-progress) wafer containers, while such wafer containers are waiting to be processed by the horizontal stack furnace. In a preferred embodiment the two storage containers are located in the elevator body 102 and will store 300 wafers (6 wafer boats) in 2 cylinder containers.

In order to reduce the costs of manufacturing the present invention, a set of solid or pneumatic rubber or polyurethane wheel assemblies 116 will be attached to the transportation base 104 of the device. Depending on the optional step features of the invention, there are generally to be at least 3 wheels, but for safety there are preferably four wheels. Wheels may be made of other materials that facilitate moving the invention about in the fabrication area with an appropriate amount of safety, cleanliness and noise.

As can be appreciated by those skilled in the art, the present invention does not need to use a specific type of elevator mechanism, but such a mechanism could vary depending on the cost of manufacturing and the varying needs of the consumer. The elevator mechanism may be controlled by manual mechanical means such as a wheel/gear mechanism. However, preferred embodiments would include a pneumatic hydraulic system, which would take up a minimum of space and power and allow for a maximum of controllability while keeping the cost of the invention reasonable. Another embodiment would include an electrical elevator, which could be powered by a battery stored in the center of the base, but which may require more complex wiring than would be desired in such a cost-effective device. The elevator mechanism is described below in FIG. 6.

The present invention also includes several optional features which allow for the elevation of the semiconductor wafer processor to be pre-programmed at specific heights would which would correspond to the heights at which the wafer boats are most easily loaded into and out of the cantilevered furnace tube loaders. Another optional feature of the present invention allows for attachments to nodes 130 for a set of steps, which may be provided on the invention or provided separately.

Figure 5:
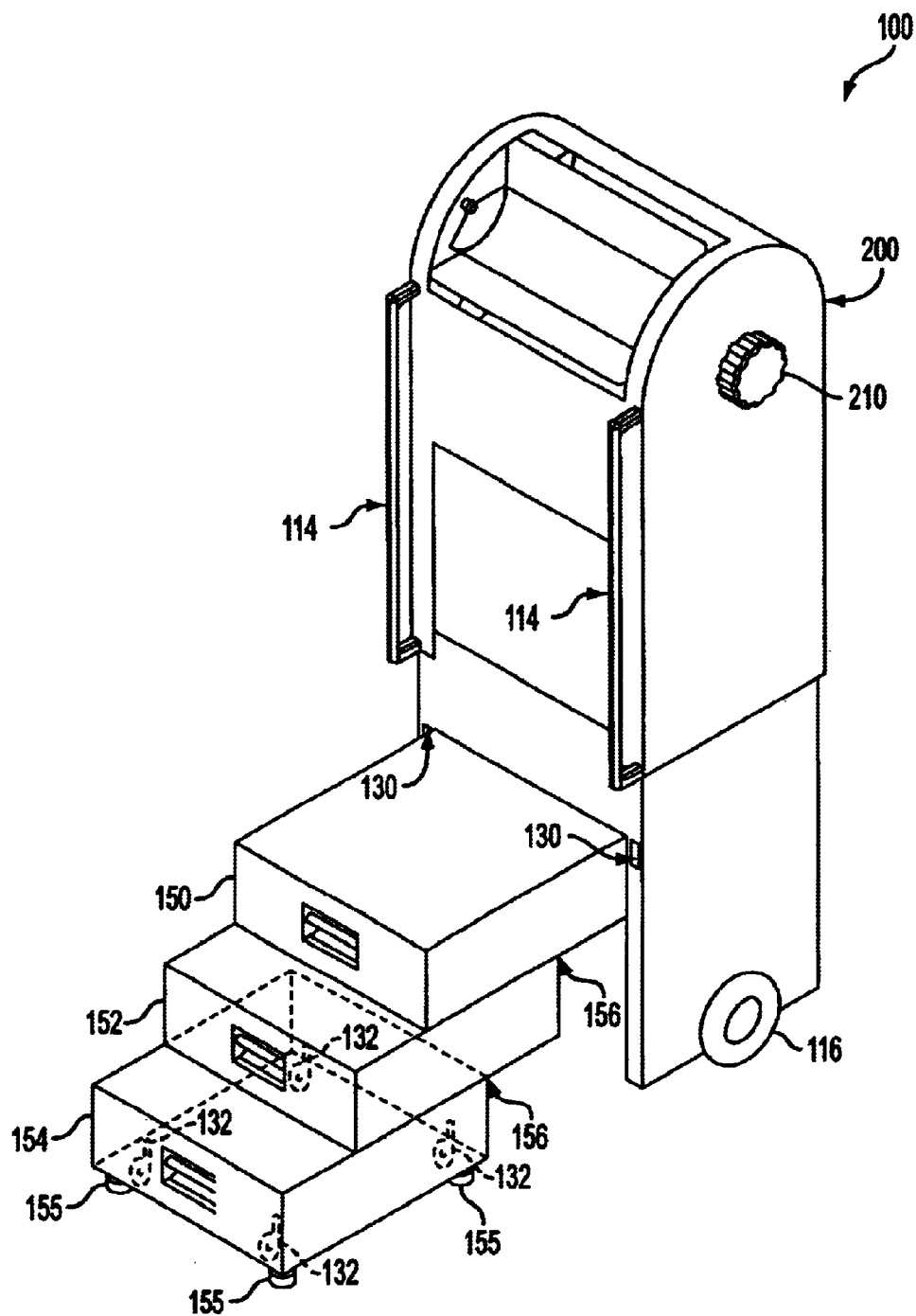
FIG. 5 is an alternate embodiment of the present invention with the stair feature.

Referring now to FIG. 5, an alternate embodiment of the present invention in which the stair feature is included is shown. The optional stair feature includes 3 folding steps 150, 152, and 154, respectively, which slide out from the transportation base 104. The base step 154 has two wheels 132 attached which will allow the elevator/transporter 100 to rotate about its axis. Also included in the stair feature are a set of stabilizers 155, which stabilize the stairs. Each stair 150, 152, and 154, has a pair of gliders/locks 156, which guide the stairs as they are being pulled out or pushed in and prevent the stairs from being pulled out too far.

In an alternate embodiment, the stairs 150 will fold into the transportation base 104 of the elevator/transporter 100, so that the elevator/transporter 100 can be transported without manually attaching or detaching the stairs from the transportation base 104.

Figure 6:
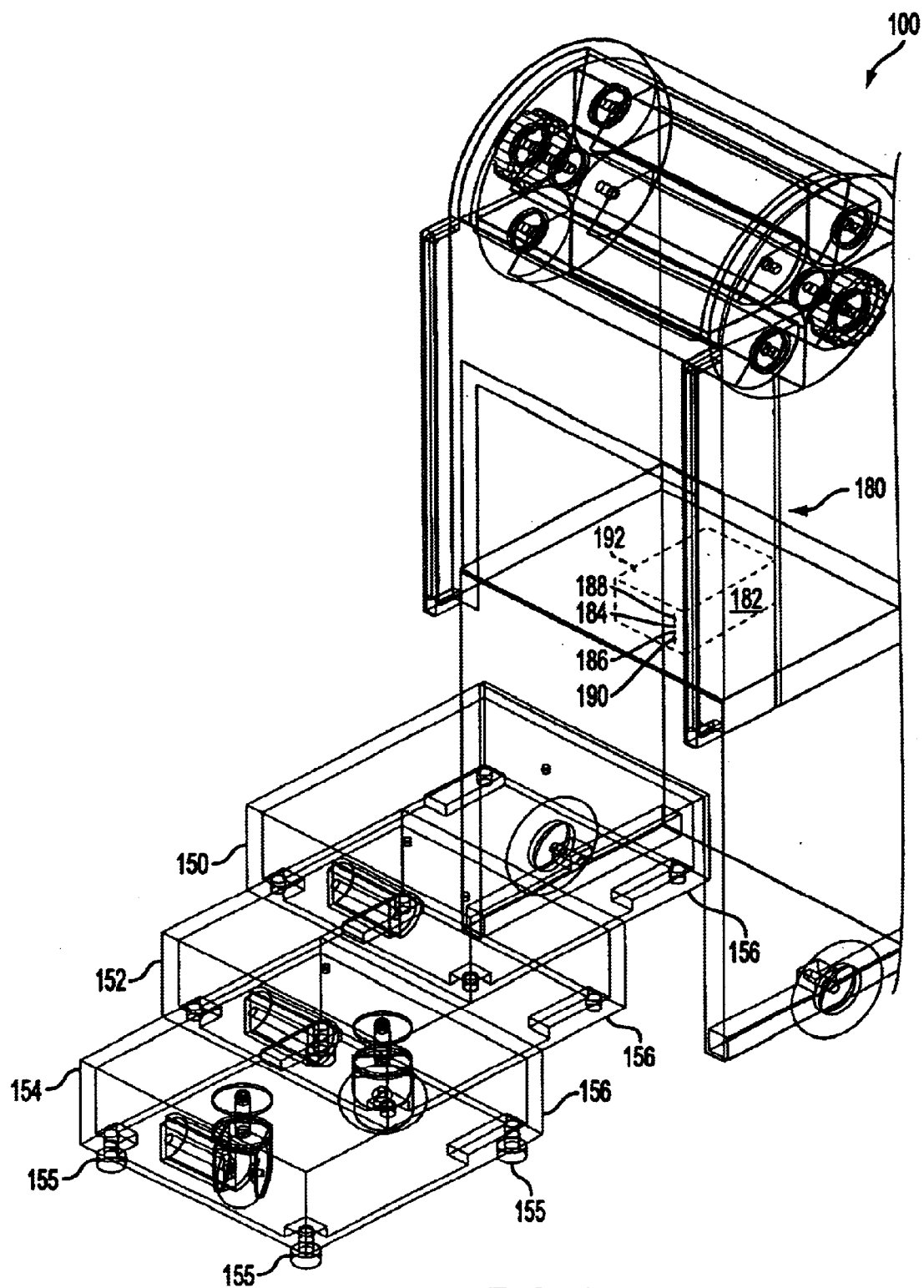
FIG. 6 is a cutaway side view of the components of the present invention.

Referring now to FIG. 6 which is a simple cutaway view of the present invention, includes a depiction one embodiment of the elevator mechanism 170 by which the drum is raised and lowered to the needed height to safely put a wafer boat into an semiconductor processing device. The elevator system comprises two pneumatic pistons which comprise a drive shaft or hydraulic pole 180, a elevator motor 182, and elevator controls 184, 186, 188, and 190 respectively. FIG. 6 represents one possible manufacture of an electromechanical elevator system with which the present invention can raise and lower itself.

A hydraulic elevator mechanism, instead of an electromechanical gear system as represented by FIG. 6 may be used in an alternate embodiment. The ergonomic, manufacturing and a cost advantages of either the manual, electromechanical and hydraulic are well known to those skilled in the art, and do not need to be detailed here. As can be appreciated by those skilled in the art of manufacturing industrial tools, the elevator mechanism 170 can be hydraulic or electromechanical and would depend on the needs of the consumer and the manufacturing cost of each perspective system. The requirements of the elevator device are not material to the novelty of the invention and the variations depend only on consumer preferences and manufacturing specification costs for each respective variation.

Figure 1:
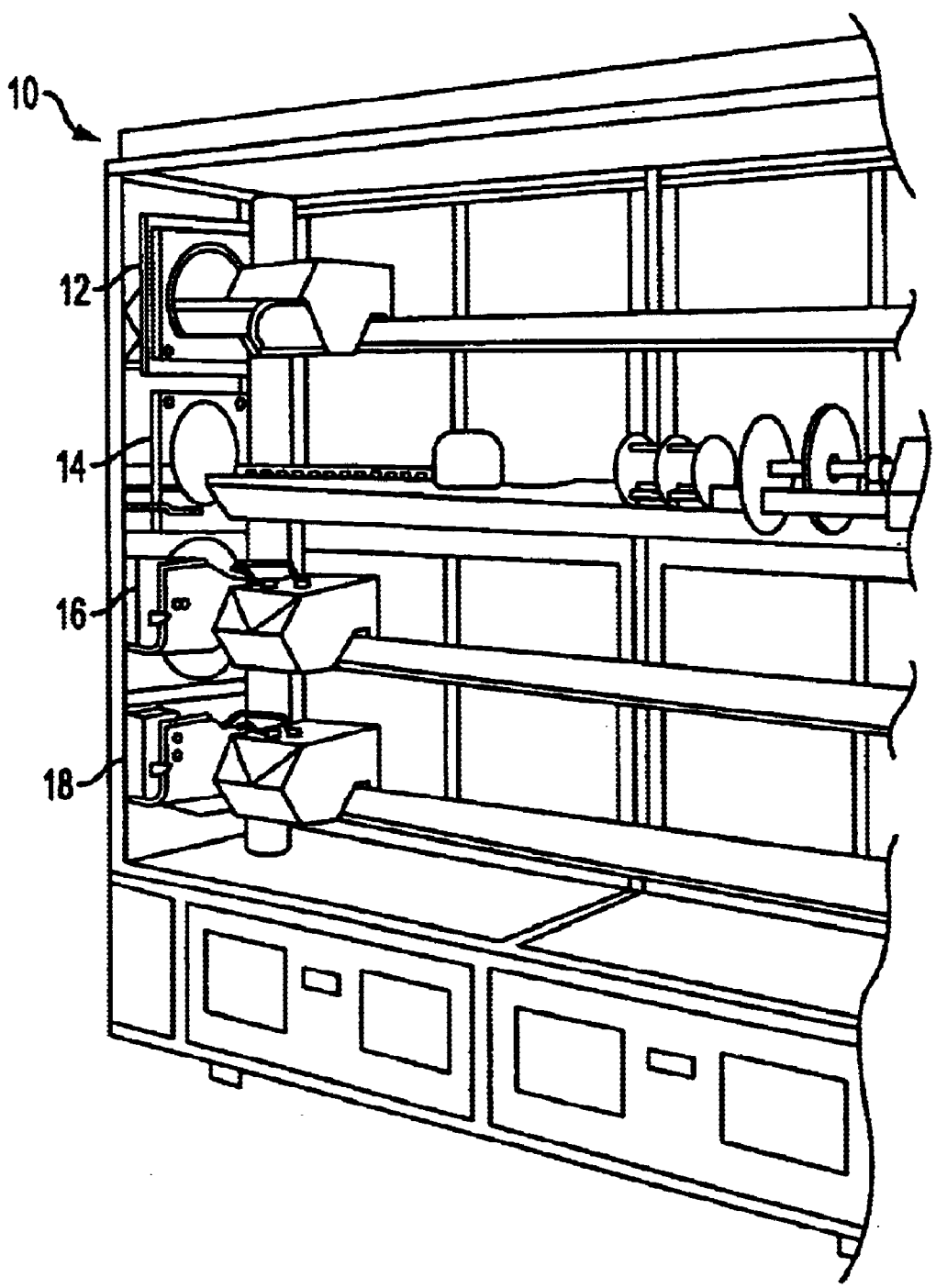
FIG. 1 represents a prior art semiconductor processing furnace or a quad stack horizontal furnace.
Figure 2:
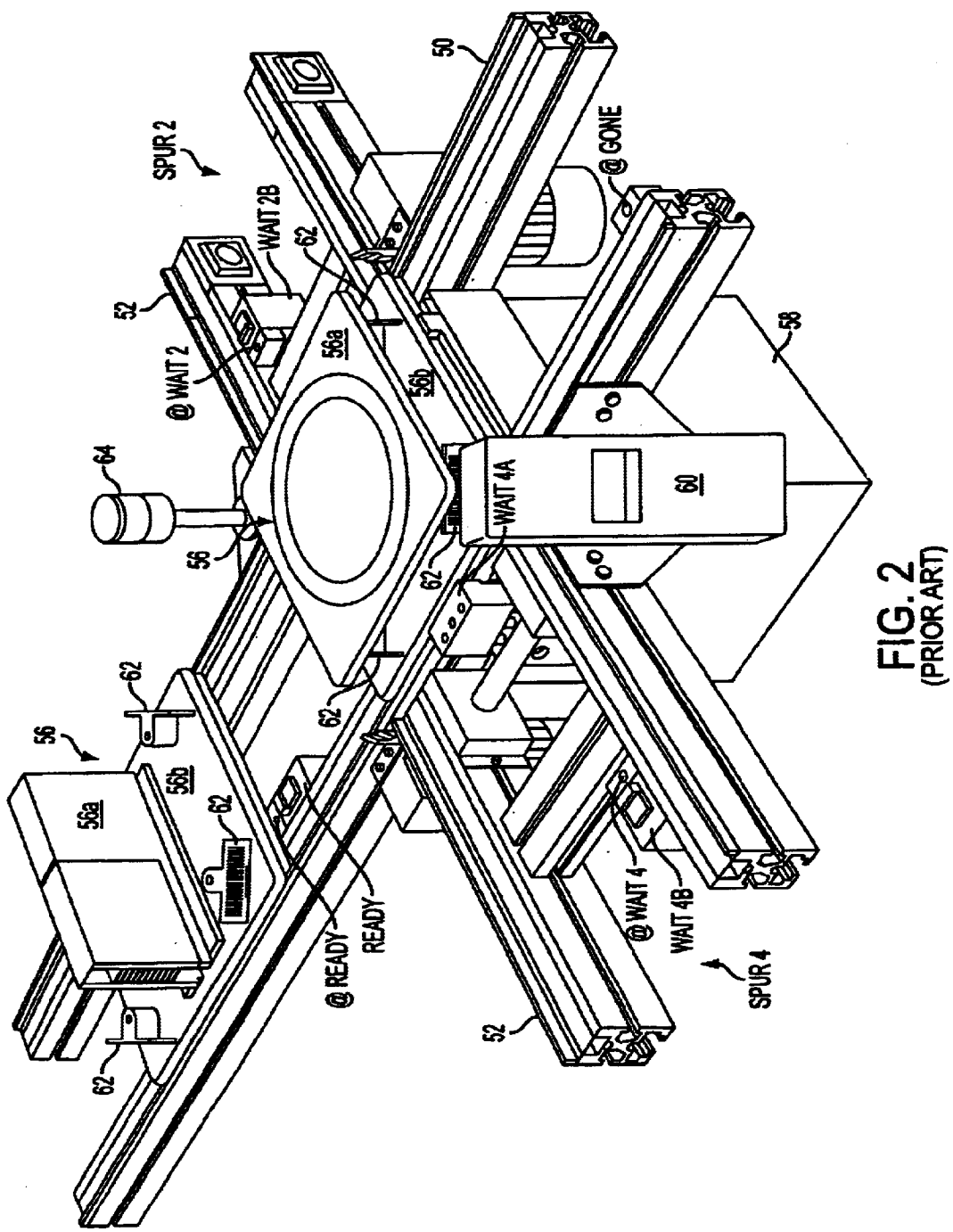
FIG. 2 represents an example of a prior art automatic wafer processing handling invention.

The elevator system 170 can be set to stop at any number of appropriate levels such as would be represented in FIG. 1 by levels 12, 14, 16 and 18 (particularly levels 16 and 18 where the height of the opening causes particular difficulty) either with an optional manual or electrical switch or an automatic stop location that is programmed for the appropriate level of the unloading height for the a semiconductor processing device. This optional feature will reduce the chance of handler error in manually attempting to stop the elevator device at the correct height and the chance of transferring wafer boats when the elevator is not at an ideal height.

Figure 7:
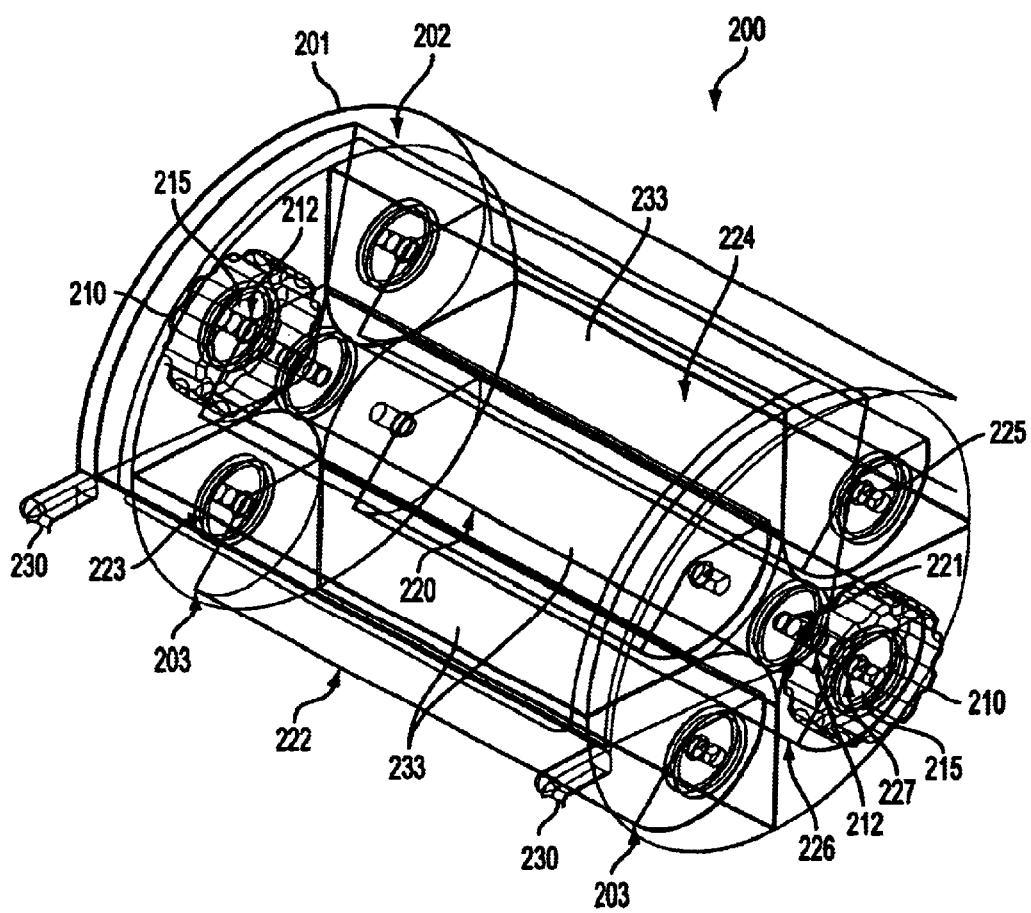
FIG. 7 is a detailed view of the drum of the present invention.

Referring now to FIG. 7, a depiction of the rotating drum delivery system 200 comprises an outer drum cover 201, a inner drum sliding semi-cylindrical cover 202, a rotation wheel 203, 2 rotating knobs 210 and 2 corresponding rotating pins 212 attached to the rotation wheel 210 via a rotation gear and axis 215. The drum delivery system also includes 4 delivery cradles 220, 222, 224 and 226 for the loading, queuing, and delivery of semiconductor wafer containers. Each of the four delivery cradles 220, 222, 224, and 226 is connected to the rotation wheel by a pin and wheel assembly 221, 223, 225, and 227 respectively. The entire drum delivery system can be connected to the main elevator body by hinge connectors 230. The four cradles 220, 222, 224, and 226 rotate about the horizontal drum axis 215 but always remain upright.

In a preferred embodiment each of the cradles 220, 222, 224, 226 have quartz glass liners 233 to support the wafer boats and prevent contamination. The semi cylindrical sliding drum cover 202 acts like a roll top desk or a bread bin and this entire assembly 202 is underneath a semi cylindrical sheet metal top cover 201 which protect the whole drum system 200.

Figure 8:
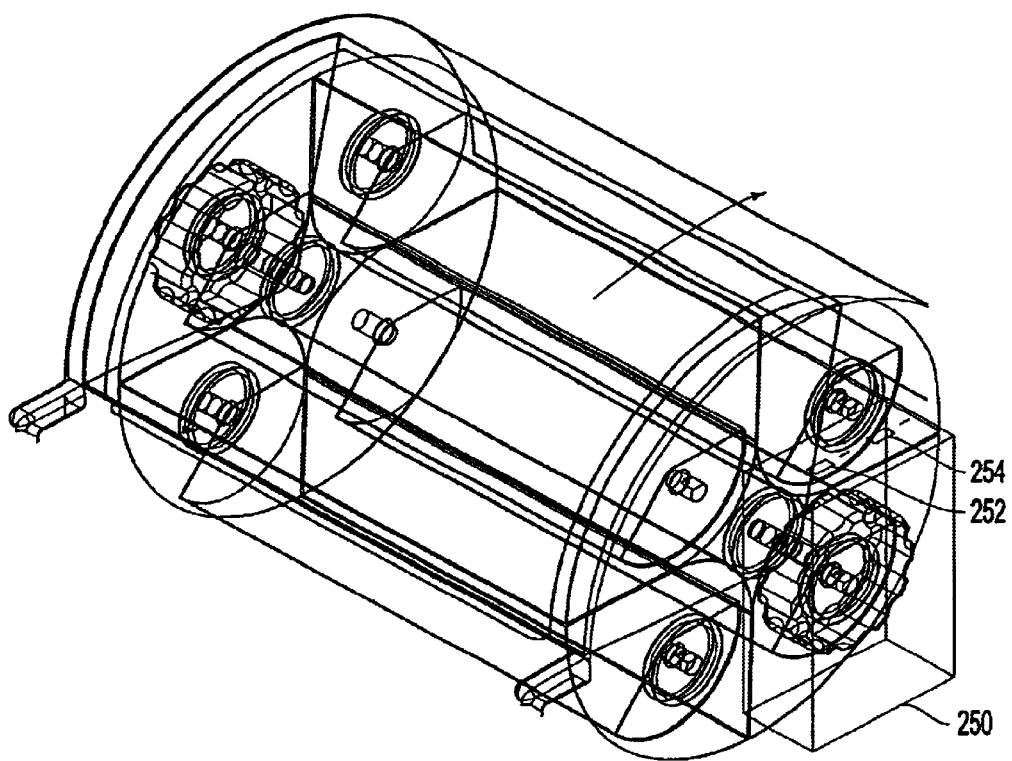
FIG. 8 is a detailed view of the drum with an optional feature of an automatic rotation feature.

Referring now to FIG. 8 a diagram of a delivery cylinder system 200 with the optional feature of a automatic rotation mechanism 250 is shown. The automatic rotation mechanism 250 attaches to the side of the rotating drum 200 and has the advantage of rotating the silicon wafer boats in a gentle and safe manner without any abrupt motions, which may occur during manual rotation. The automatic rotation mechanism 250 is controlled by rotation controls 252 and 254, and in a preferred embodiment will also be able to keep track of which cylinder of wafer boats is to be loaded onto 10 which device so that the operator does not process the incorrect batch. In an optional embodiment, the controls 252 and 254 are coordinated for the 4 respective cylinders and will place the cylinder containing the correct wafer boats in a position in which the wafers boats are most easily loaded and unloaded from the semiconductor processing devices, usually at the height of the opening(s) of the stack oven or other processing device. This is also described herein as the "first specified herein." Thus the device can track which set of wafer boats are to be unloaded into which processing device and in which order and execute accordingly.

As can be appreciated by those skilled in the art, a simpler configuration of the any automatic rotation mechanism 250 the more cost effective the system. More complicated a automatic rotation mechanisms are contemplated by the invention, for example rotation mechanism 250 may be gear driven and fits over the manual rotation knob 210, or can be belt driven, or can be driven, or completely replace the manual rotation knob. In a preferred embodiment, the rotation mechanism is manually operated, reducing cost.

Another optional feature of the invention allows the cylindrical cradles each to be labeled manually or electronically or in a color coded fashion to facilitate correct delivery of the semiconductor wafer containers to the semiconductor processing device.

Figure 9:
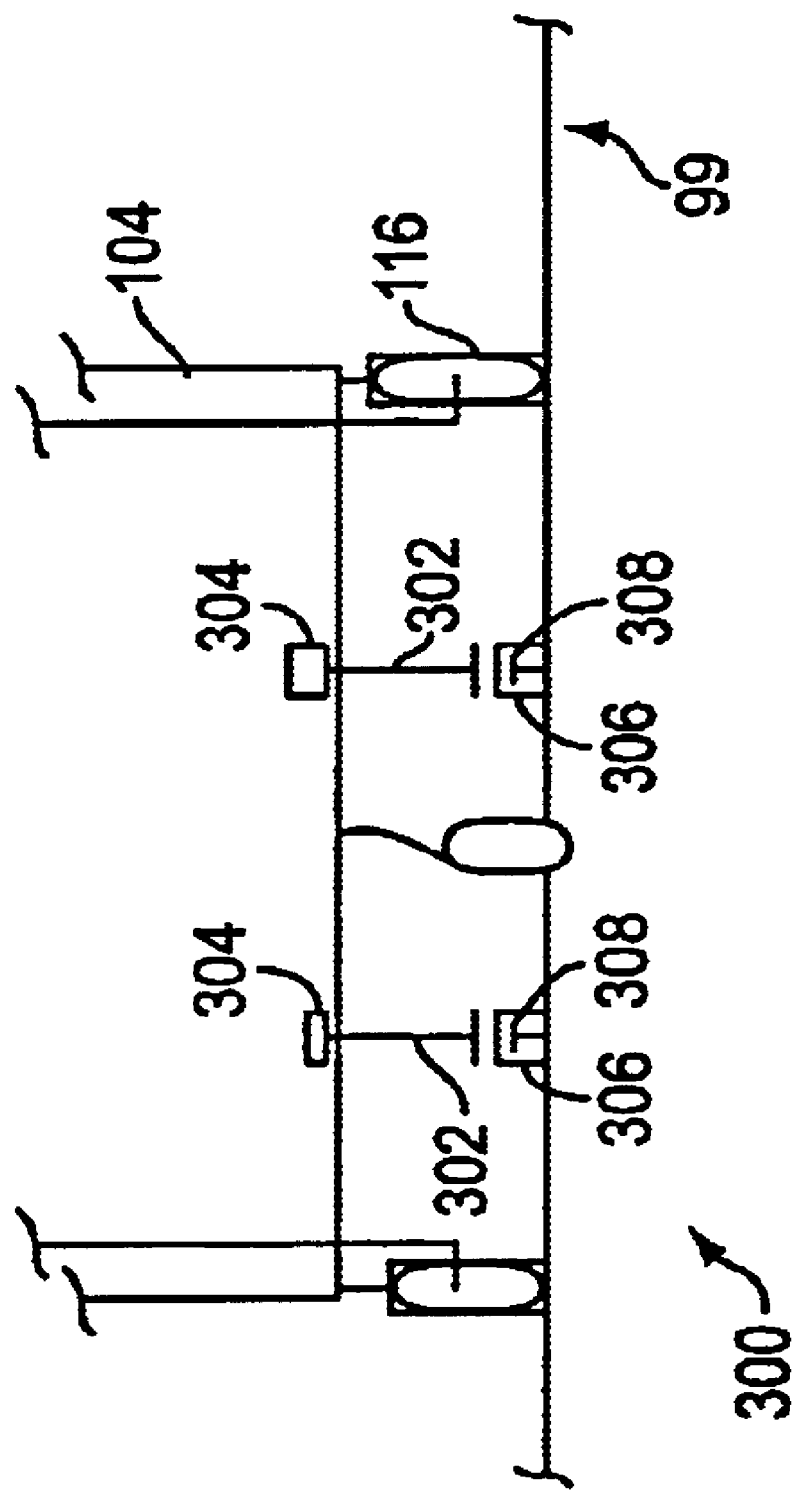
FIG. 9 is a block diagram of the docking system of the present invention.

Referring now to FIG. 9 another optional feature of the invention includes a safety docking system 300 which is comprised of a "shoe" 306 for a docking module 302 and a docketing detector 304. The shoe 306 is bolted either to the floor or the base of the load station 99 and may or may not have an optional catch 308. The shoe 306 engages a docking module 302 and in a preferred embodiment one docking module 302 is fitted on each side of the base of the invention as it is rolled into position. The purpose of the docking module/shoe combination 300 is to eliminate any possibility that ET 100 can be tipped over when it becomes top heavy in the elevated position. The docking module 302 is fitted with a preferred switch 304 which to prevent elevator 170 from rising if the shoe 306 is not docked. As can be appreciated by those skilled in the art, the docking modules/shoe combination 300 can be implemented in several different ways, each of which may depend on the fabrication area specifications and manufacturing requirements. Such variations would not depart from the scope of the invention.

Figure 10:
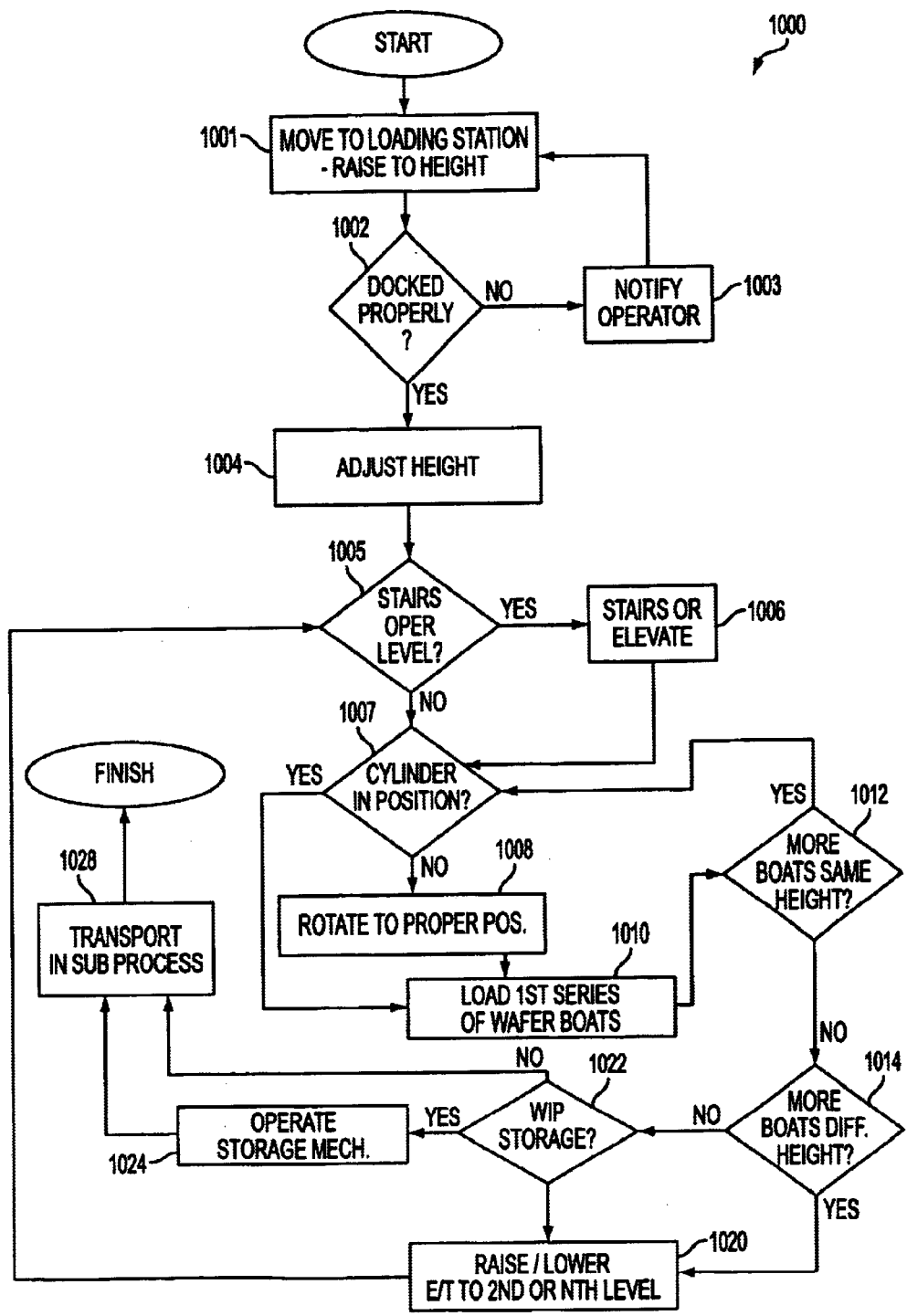
FIG. 10 is a flow diagram of the process by which a semiconductor wafer is manufactured using the present invention.

Referring to FIG. 10, a flow diagram of a method of processing a semiconductor 1000 which includes the implementation of the present invention is shown with the optional docking module/shoe feature. In step 1001, the operator carts the E/T over to a first wafer boat loading station and raises the elevator to the level of the first wafer boat to be loaded. Such a station will most likely be a transfer or loading station. In step 1002 it is determined whether the invention is in proper position by reading whether the pressure switch 304 on the docking station 302 has been activated by the shoe 306. In step 1003 if the E/T is not in place then it will make a simple beep or other notification so that the operator can move it into proper position. In step 1004, if the E/T is in proper position, it will raise and lower according to the operator's commands.

In step 1005, if this station requires the operator climb to the needed level, the optional E/T steps will be put into place and attached to the optional step attachment 130 in step 1006. The steps are an optional feature of the invention and other climbing apparatus may be available to the operator, such as an automatic platform with a safety gate, which is part of the E/T.

In step 1007, the operator determines if the first cylinder in the drum is in the correct position and, if it is not then in step 1008, the operator rotates the drum to the correct position for the first wafer boat. As can be appreciated by those skilled in the art, a manual rotation device would provide the most economical design of the invention, but other embodiments may be implemented which would require an electrical or even computer controlled rotation of the drum in order to minimize the possibility of operator error. In step 1010, the operator loads the first series of wafer boats in the first cylinder contained in the drum. Generally, speaking the invention will allow three standard wafer boats to be loaded into each cylinder. In step 1012 if there are more boats to be loaded at the same height at the same semiconductor processing device, the cylinder is checked again in step 1007 to see if the loading cylinder is correctly positioned.

In step 1014 if there are more boats to be loaded at another height at the same semiconductor processing device, then the invention is raised to the proper height for loading a second series of boats in step 1020, at which point the process returns to step 1006. If there are determined to be WIP storage requirements in step 1022, the operator then can open the optional storage mechanism/containers 124, 126 in the elevator body 102 and put the wafer WIPs into storage for later processing in step 1024. In step 1028 the device is then transported to the next semiconductor processing device after the stairs are removed or folded into the transporter base 104.

The foregoing examples illustrate certain exemplary embodiments of the invention from which other embodiments, variations, and modifications will be apparent to those skilled in the art. The invention should therefore not be limited to the particular embodiments discussed above, but rather is defined by the following claims.

I claim:

1. A device for assisting in the manufacture of a semiconductor wafer, comprised of:
   means for loading and storing a set of one or more semiconductor wafer containers from any semiconductor processing device;
   means for queuing said set of one of more semiconductor wafer containers including a semi-cylindrical drum and means for rotating said semi-cylindrical drum
   means for transporting said device;
   means for elevating said set of one of or more semiconductor wafer containers to a first height;
   means for setting said first height at a level of an opening of a semiconductor processing device;
   wherein all of the above means are contained within a single unit.

2. The device for assisting in the manufacture of a semiconductor wafer as recited in claim 1, wherein said first height is a height of an furnace opening.

3. The device as recited in claim 2, wherein said furnace opening is an furnace opening for a quad stack horizontal furnace.

4. The device as recited in claim 1, wherein said means for elevating is programmed to rise or fall to said first height automatically.

5. The device as recited in claim 1, additionally comprised of means for providing short-term storage of one or more semiconductor wafer containers.

6. The device as recited in claim 1, wherein said semi-cylindrical drum further comprises a set of semi-cylindrical cradles for storing semiconductor wafer containers and said rotating means being for a presentation of one of said set of semi-cylindrical cradles at a first given level.

7. The device as recited in claim 6, wherein any of said set of semi-cylindrical cradles holds at least one semiconductor wafer container.

8. The device as recited in claim 6, wherein said first given level is said first height.

9. The device for assisting in the manufacture of a semiconductor wafer as recited in claim 1, further comprised of a second elevating means for raising or lowering an operator to a second height.

10. The device as recited in claim 9, wherein said second height is dependent upon said first height.

11. The device as recited in claim 9, wherein said second elevating means is comprised of stairs.

12. The device as recited in claim 9, wherein said second height is located where an operator can most efficiently load or unload any of said set of one or more semiconductor wafer containers.

13. The device as recited in claim 9, wherein said second elevating means is a platform capable of being raised and lowered by non-manual operation.

14. The device for assisting in the manufacture of a semiconductor wafer as recited in claim 1, further comprised of means for providing stability for an operator.

15. The device for assisting in the manufacture of a semiconductor wafer as recited in claim 1, further comprised of means for shielding said set of one or more semiconductor wafer containers from the environment while said device is being transported.

16. The device as recited claim 15, wherein said means for shielding is a sliding panel, in said semi-cylindrical drum.

17. The device as recited in claim 1, further comprised of means for stabilizing said device during the time at which said device is being used to load or unload.

18. The device as recited in claim 17, wherein said means for stabilizing comprises a docking station and a shoe wherein said docking station and said shoe are configured to lock, when both are in a proper docking placement said proper docking placement corresponding to a correct location for said device to load and unload wafers.

19. The device as recited in claim 17, wherein said stabilizing means comprises a pressure sensor, said pressure sensor being activated when said device is properly placed for loading and unloading wafers, said first or second elevating means configured such that they cannot be operated unless said pressure sensor is activated.

20. A device for assisting in the manufacture of a semiconductor wafer including:
   a set of two bodies, of which a lower body fits under a top body, so that said top body can be moved vertically along an outer surface of said lower body;
   a rotating drum with a cover attached to the top of said top body, said rotating drum including at least one device for rotating at least one inner elliptical plate to which is attached a plurality of horizontal semi-cylindrical cradles, said cover providing an opening to the interior of said drum, wherein said plurality of cylindrical cradles is configured to each hold at least one wafer boat;
   a height guide for assistance in raising or lowering said drum opening to one or more pre-set heights, and wherein attached to said lower body is a set of at least three wheels configured to allow said device to move in a forward and backward direction in addition to being rotated in either direction, such that said device is rotated near to or on a vertical axis, thereof.

21. The device as recited in claim 20, wherein said top body is moved vertically by an elevator mechanism.

22. The device as recited in claim 21, wherein said elevator mechanism is a hydraulic elevator mechanism or an electrical elevator mechanism.

23. The device as recited in claim 20, further comprised of a docking system located on the underside of said lower body.

24. The device as recited in claim 23, wherein said docking system includes a pressure sensor, said pressure sensor for determining when said device is properly positioned to unload a wafer boat.

25. The device as recited in claim 20, wherein said height guide is manually set.

26. The device as recited in claim 20, wherein said cover includes a sliding panel, over a portion of its surface.

27. The device as recited in claim 20, wherein said one or more pre-set heights corresponds to at least one opening for a semiconductor processing device, including a horizontal stack oven.

\* \* \* \* \*